(12) United States Patent
Trotta et al.

(10) Patent No.: US 8,810,330 B2
(45) Date of Patent: Aug. 19, 2014

(54) DC POWER SUPPLY CIRCUIT, OSCILLATOR CIRCUIT AND METHOD FOR GENERATING A DC POWER SUPPLY SIGNAL

(75) Inventors: Saverio Trotta, Munich (DE); Winfried Bakalski, Munich (DE); Herbert Knapp, Munich (DE)

(73) Assignee: Infineon Technologies AG, Neubiberg (DE)

(*) Notice: Subject to any disclaimer, the term of this patent is extended or adjusted under 35 U.S.C. 154(b) by 43 days.

(21) Appl. No.: 13/619,963

(22) Filed: Sep. 14, 2012

(65) Prior Publication Data

US 2014/0077892 A1 Mar. 20, 2014

(51) Int. Cl.
 *H03L 1/00* (2006.01)
 *G05F 1/46* (2006.01)
(52) U.S. Cl.
 USPC ......................................... 331/186
(58) Field of Classification Search
 USPC .......... 327/530, 535, 538, 540, 548; 331/185, 331/186; 455/127.1
 See application file for complete search history.

(56) References Cited

U.S. PATENT DOCUMENTS

| | | | |
|---|---|---|---|
| 5,481,229 A * | 1/1996 | Connell et al. | 331/158 |
| 5,719,534 A * | 2/1998 | Imura | 331/186 |
| 6,359,814 B1 * | 3/2002 | Sundaram et al. | 365/189.09 |
| 6,927,711 B2 * | 8/2005 | Endo et al. | 341/122 |
| 7,103,331 B2 * | 9/2006 | Motoyama | 455/127.1 |
| 7,126,433 B2 * | 10/2006 | Godambe et al. | 331/74 |
| 7,586,379 B2 * | 9/2009 | Shimizu | 331/16 |
| 7,616,075 B2 * | 11/2009 | Kushiyama | 331/186 |
| 7,728,677 B2 * | 6/2010 | Logan | 331/17 |
| 7,808,306 B2 * | 10/2010 | Ito | 327/540 |
| 7,880,554 B2 * | 2/2011 | Raghunathan et al. | 331/186 |
| 8,102,217 B2 * | 1/2012 | Aoki | 331/160 |
| 8,362,848 B2 * | 1/2013 | Raghunathan et al. | 331/186 |

OTHER PUBLICATIONS

"Fractional-N Frequency Synthesizer," Analog Devices, Data Sheet ADF4154, Rev. C, Aug. 2012, 24 pages.

* cited by examiner

*Primary Examiner* — Levi Gannon
(74) *Attorney, Agent, or Firm* — Slater & Matsil, L.L.P.

(57) ABSTRACT

A DC power supply circuit comprises an output configured to provide a power supply signal to an RF element for generating an RF output signal. Furthermore, the DC power supply circuit comprises an input configured to receive the RF output signal. The DC power supply circuit is configured to generate the DC power supply signal based on the received RF output signal.

23 Claims, 12 Drawing Sheets

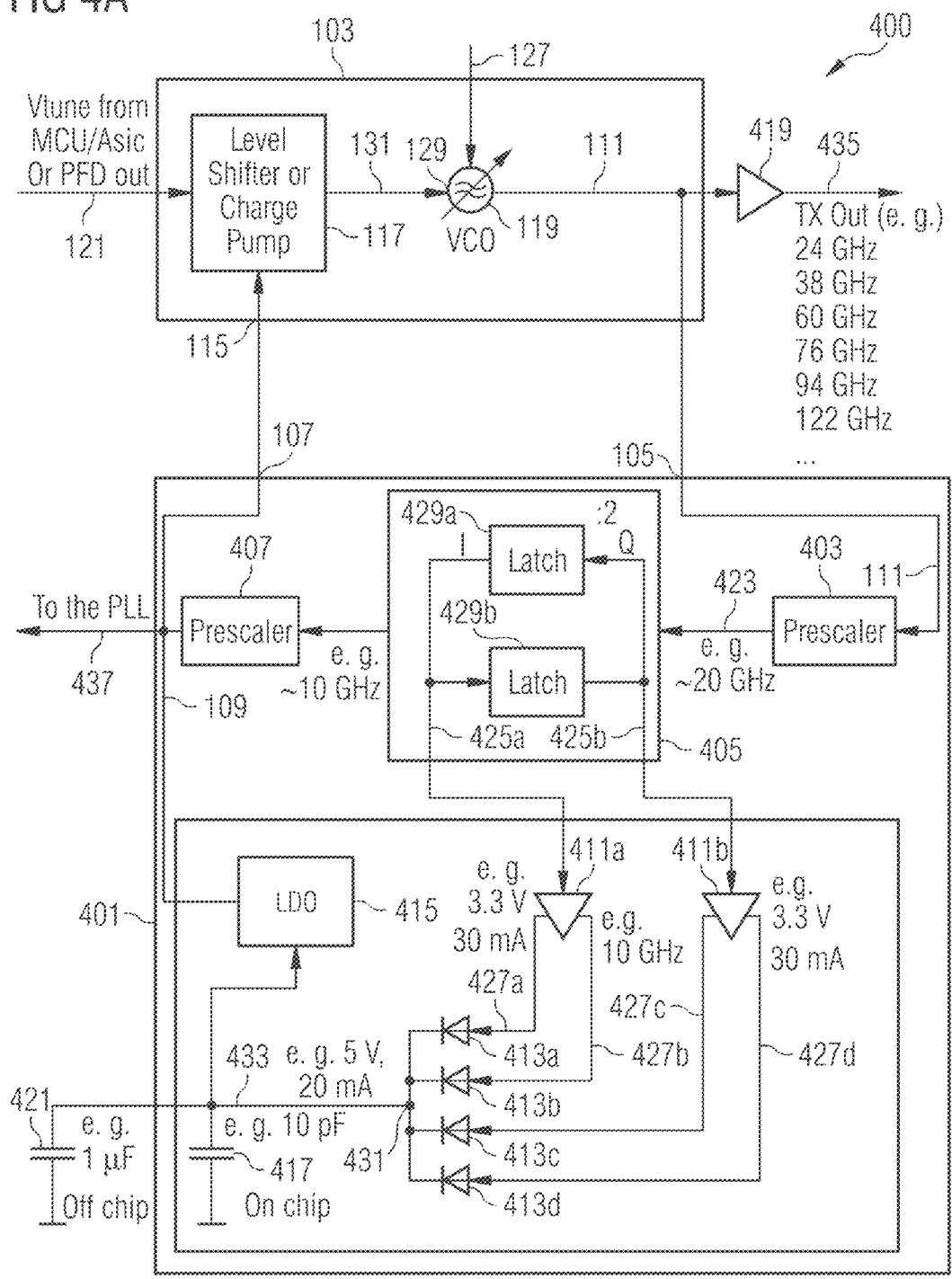

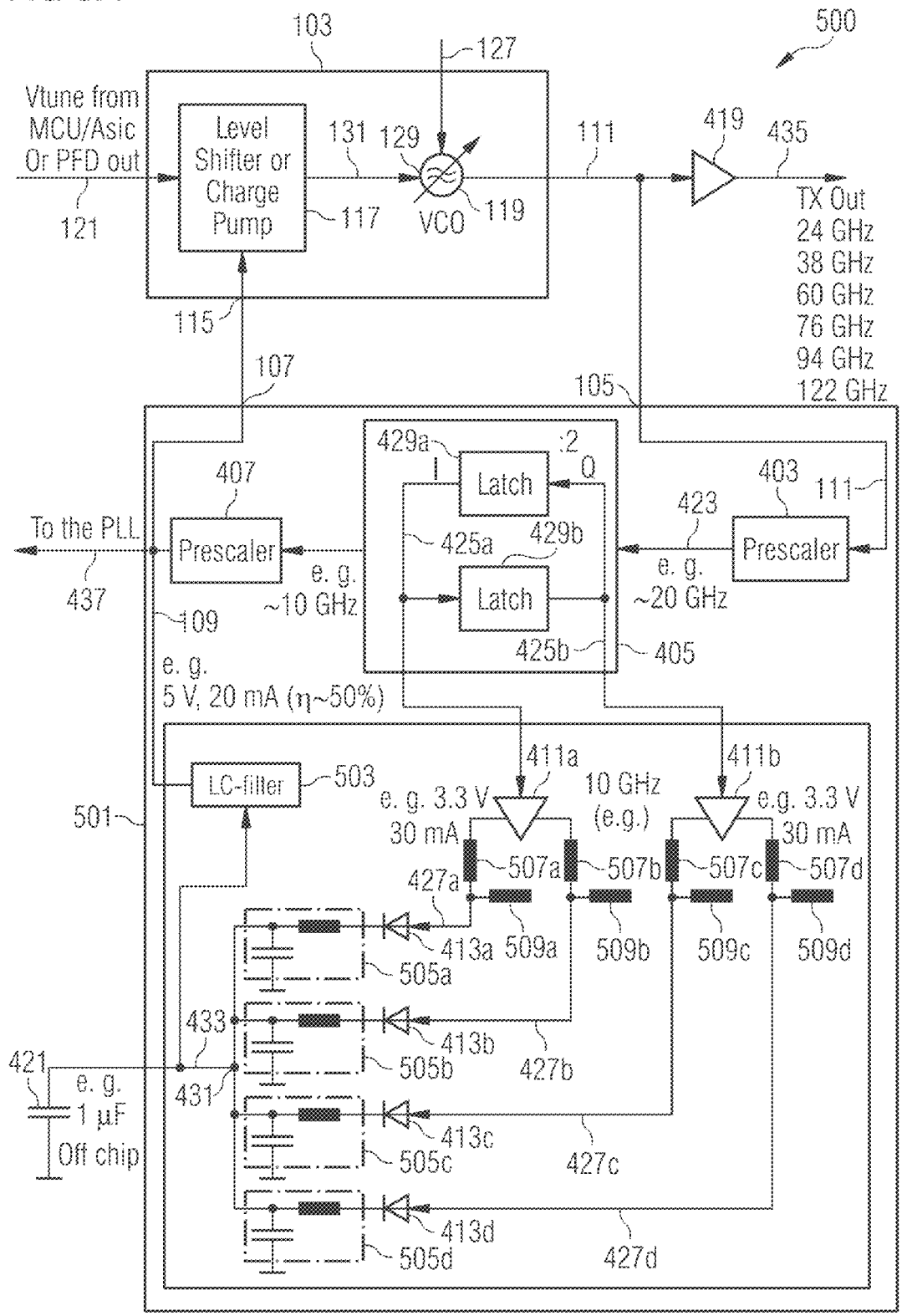

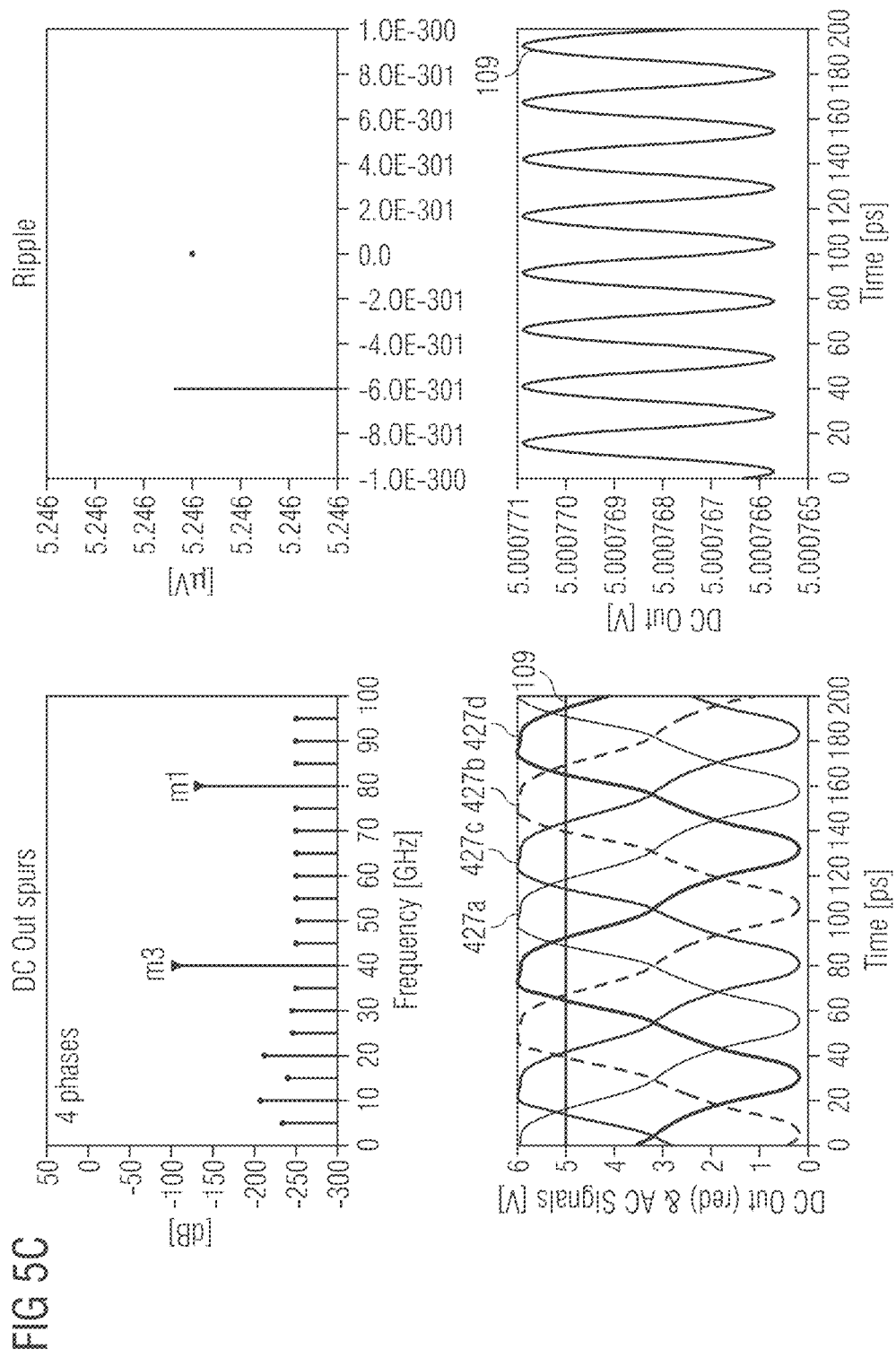

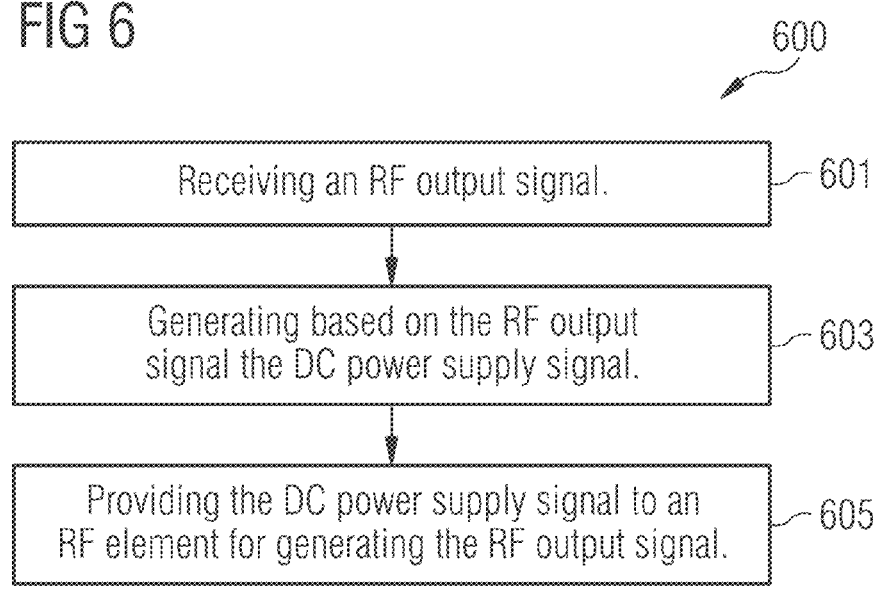

DC POWER SUPPLY CIRCUIT, OSCILLATOR CIRCUIT AND METHOD FOR GENERATING A DC POWER SUPPLY SIGNAL

TECHNICAL FIELD

Embodiments of the present invention relate to a DC power supply circuit. Further embodiments of the present invention relate to an oscillator circuit comprising an RF element. Further embodiments of the present invention relate to a method for generating a DC power supply signal.

BACKGROUND

Conventional transmitters have the disadvantage that a plurality of different voltage domains are required on such a transmitter which can lead to a complex and expensive power management.

Hence, it is desired to provide a concept which reduces the number of required voltage domains to be provided by a supply voltage regulator in an RF system.

SUMMARY OF THE INVENTION

Embodiments of the present invention relate to a DC power supply circuit comprising an output configured to provide a DC power supply signal to an RF element for generating an RF output signal. Furthermore, the DC power supply circuit comprises an input configured to receive the RF output signal. The DC power supply circuit is configured to generate the DC power supply signal based on the received RF output signal.

Furthermore, further embodiments of the present invention relate to an oscillator circuit comprising such DC power supply circuit and an RF element configured to receive a tuning signal and to provide based on the tuning signal an RF output signal.

BRIEF DESCRIPTION OF THE DRAWINGS

Embodiments of the present invention will be described in detail using the accompanying figures, in which:

FIG. 4a shows an oscillator circuit according to an embodiment of the present invention comprising a DC power supply circuit according to an embodiment of the present invention comprising a low dropout regulator;

FIG. 5a shows an oscillator circuit according to a further embodiment of the present invention comprising a DC power supply circuit according to a further embodiment of the present invention comprising an LC filter at its output;

FIG. 5b shows an exemplary implementation for the LC filter from the DC power supply circuit in FIG. 5a;

FIG. 5c shows a simulation of signals generated in the DC power supply circuit from FIG. 5b without an additional capacitance connected to the DC power supply circuit;

FIG. 5d shows a simulation the DC signals from FIG. 5c with an additional external capacitance connected to the DC power supply circuit from FIG. 5a; and FIG. 6 shows a flow diagram of a method according to an embodiment of the present invention.

DETAILED DESCRIPTION OF ILLUSTRATIVE EMBODIMENTS

Before embodiments of the present invention are described in detail using the accompanying figures, it is to be pointed out that the same elements or functionally equal elements are provided with the same reference numbers and that a repeated description for elements having the same reference numbers is omitted.

Figure 1:
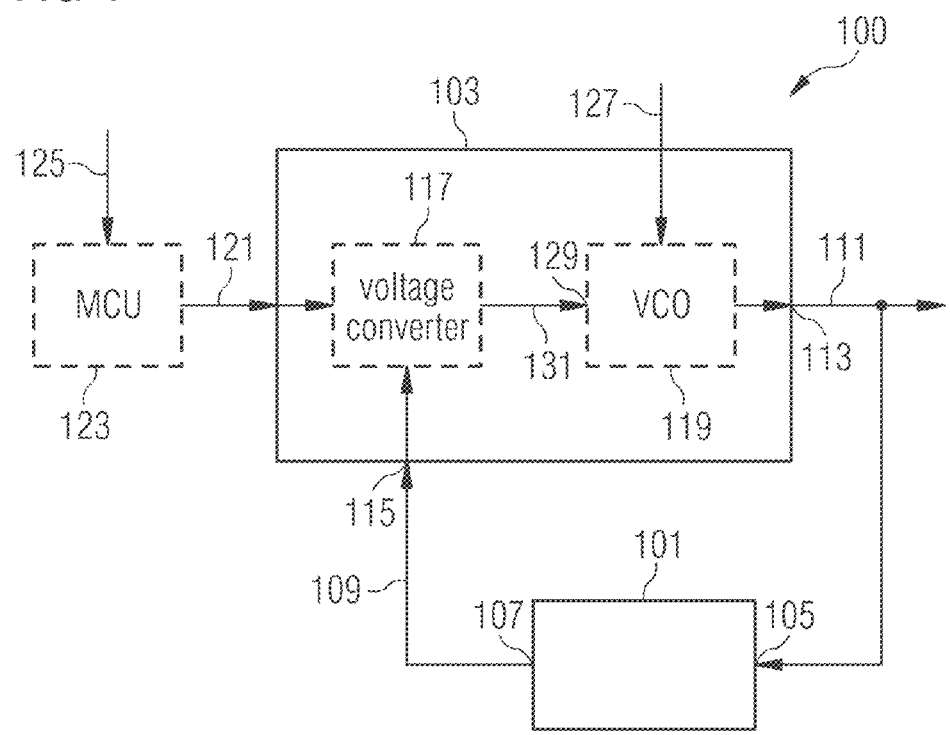
FIG. 1 shows an oscillator circuit according to an embodiment of the present invention comprising an RF element and a DC power supply circuit according to an embodiment of the present invention.

FIG. 1 shows an oscillator circuit 100 according to an embodiment of the present invention. The oscillator circuit 100 comprises a DC power supply circuit 101 according to an embodiment of the present invention. Furthermore, the oscillator circuit 100 comprises an RF element 103. The DC power supply circuit 101 comprises an input 105 and an output 107. The output 107 of the DC power supply circuit 101 is configured to provide the DC power supply signal 109 to the RF element 103 for generating an RF output signal 111. The input 105 is configured to receive the RF output signal 111.

As an example, the generated DC power supply signal 109 can have a ripple of at maximum 10%, 5% or 1% of its amplitude.

Furthermore, the DC power supply circuit 101 is configured to generate the DC power supply signal 109 based on the received RF output signal 111. The DC power supply signal 109 provided to the RF element 103 is used by the RF element 103 to generate the RF output signal 111. By having the DC power supply circuit 101 which is connected between an RF output 113 of the RF element 103 and a DC power supply input 115 of the RF element 103 a supply voltage domain (for the DC power supply signal 109) can be saved when compared to conventional systems, as the DC power supply signal 109 is directly derived from the RF output signal 111 which is anyway generated in the oscillator circuit 100.

FIG. 1 shows an exemplary implementation of the oscillator circuit 100 in which the RF element 103 comprises a voltage converter 117 and a VCO 119 (VCO-voltage controlled oscillator). The voltage converter 117 is configured to receive the DC power supply signal 109 from the DC power supply circuit 101. Furthermore, the RF element 103 is configured to receive a tuning signal 121 in dependence of which the RF element 103 provides the RF output signal 111.

As an example, the tuning signal 121 can be provided by an MCU 123 (MCU-micro controller unit). Alternatively the tuning signal 121 can be provided by an ASIC or a phase frequency detector (PFD). The MCU 123 is configured to receive a MCU supply signal 125 based on which the MCU provides the tuning signal 121 to the RF element 103. Furthermore, the VCO 119 is configured to receive a VCO supply signal 127 based on which it provides the RF output signal 111. As a way of example considering the MCU supply signal 125 being in a first voltage domain (for example 1.2V), the tuning signal 121 is limited to this voltage domain. Hence, the tuning signal 121 could not go above this 1.2V (or even not above 1V). In contrast to this, the VCO supply signal 127 could be in a second voltage domain (e.g., 3.3V) and a tuning input 129 of the VCO 119 could even go up to 6V. Hence, if now the tuning signal 121 would be directly be applied to the tuning input 129 of the VCO 119, only a small available frequency range of the VCO 119 for the generation of the RF output signal 111 could be used.

Hence, the voltage converter 117 is switched between the MCU 125 and the tuning input 129 of the VCO 119. The voltage converter 117 is configured to receive the tuning signal 121 from the MCU 123 in the first voltage domain and is configured to provide a further tuning signal 131 to the tuning input 129 of the VCO 119. The voltage converter 117 is configured to provide the further tuning signal 131 based on the DC power supply signal 109. Furthermore, the voltage converter 117 is configured to provide the further tuning signal 131 in a third voltage domain (which in the example could go up to 6V) having a maximum voltage which is even larger than a maximum voltage of the VCO supply signal 127.

Hence, by having the voltage converter 117 between the MCU 123 and the VCO 119, the full tuning range of the VCO 119 can be used.

As an example the voltage converter is configured to provide the further tuning signal 131 such that is follows changes of the tuning signal 121.

Furthermore, by having the DC supply circuit 101 according to an embodiment of the present invention providing the DC power supply signal 109 based on the RF output signal 111 an additional voltage regulator for generating the DC power supply signal 109 and even a complete additional supply voltage domain can be saved when compared to conventional systems in which for each supply voltage (for the MCU power supply signal 125, the VCO power supply signal 127 and the DC power supply signal 109) an additional regulator or supply domain is spent.

Figure 2:
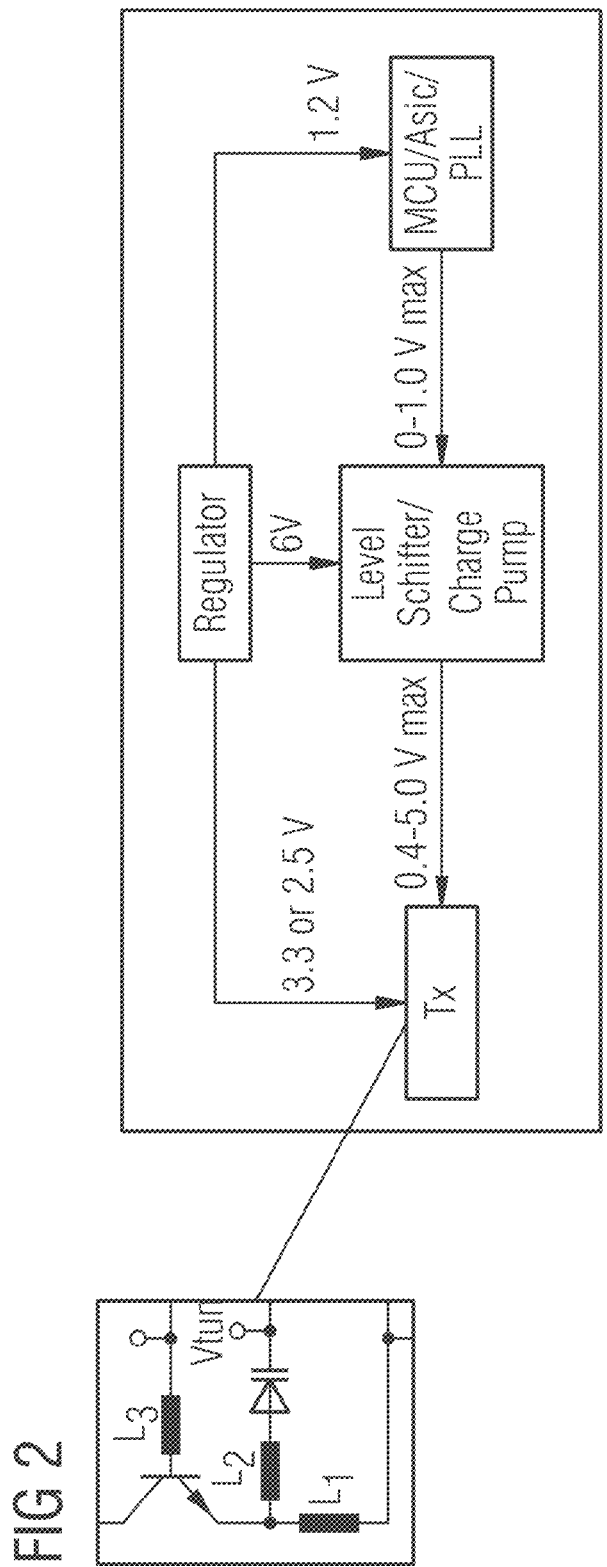
FIG. 2 shows a conventional transmitter comprising three different voltage domains.

FIG. 2 shows an example for a conventional transmitter in which three different voltage domains are necessary for the RF front end, the level shifter or charge pump and the MCU/ASIC/PLL. As way of example, considering a MCU supplied with 1.2V in 40 nm CMOS. The DAC (digital-to-analog converter) on the MCU could be used to tune the VCO in the RF front end chip. The RF front end chip (Tx) is supplied with 3.3V or 2.5V while its Vtune port could go up to 6V, for example. Since the MCU output cannot go above 1V, the external level shifter is needed to drive correctly the Vtune port and to use the complete tuning capacitances available or to skip parts of the tuning range not useful (e.g., for a DC coupled varactor a tuning range starting from 1V could be helpful). In order to be able to tune up to 5V, the level shifter would need 6V. This means, the conventional system shown in FIG. 2 would require on board at least three VCC domains: 1.2, 3.3 and 6V. Hence, the power management could become quite complex and expensive. To summarize, even if the Tx required a lower supply voltage the varactor of the VCO could still require a larger voltage to make the complete tuning range available.

Figure 3:
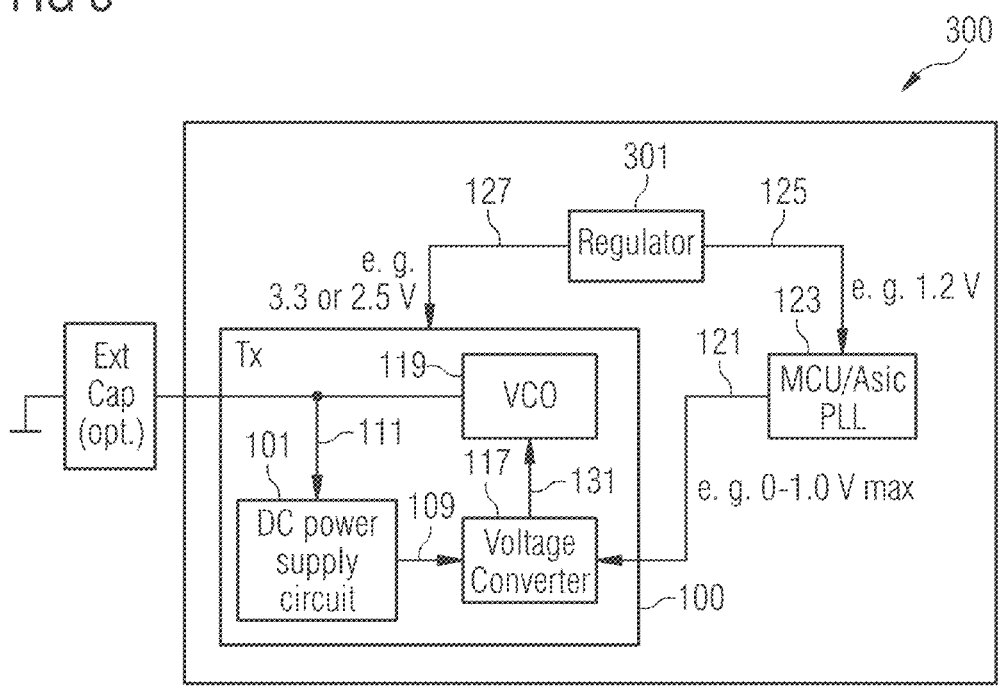
FIG. 3 shows a transmitter according to an embodiment of the present invention comprising an oscillator circuit according to an embodiment of the present invention.

FIG. 3 shows in contrast to FIG. 2 an implementation for a transmitter 300 according to an embodiment of the present invention making use of the oscillator circuit 100 shown in FIG. 1. As can be seen in FIG. 3 a supply signal regulator 301 is sufficient that provides the MCU power supply signal 125 and the VCO power supply signal 127, as the DC power supply signal 109 for the voltage converter 117 is supplied by the DC power supply circuit 101 based on the RF output signal 111 which is anyway generated in the oscillator circuit 100.

The DC power supply circuit 101 can be implemented as a DC/DC converter on the chip together with the RF element 103. The DC power supply signal 109 generated (the voltage generated by the DC power supply circuit 101) can be used to drive the voltage converter 117 on chip. Since its current consumption is not too large, the efficiency could still be a minor issue compared to the system's complexity. Furthermore, by using a fast IT (fast transient) technology, the DC power supply circuit 101 could work at (e.g.,) 10 GHz making easier the filtering.

As an example, the voltage converter 117 comprises a level shifter or a charge pump for converting a level of the tuning signal 121 in a lower voltage domain to a higher voltage domain of the further tuning signal 131 based on the received DC power supply signal 109.

FIG. 4a shows an oscillator circuit 400 according to a further embodiment of the present invention which is an exemplary implementation of the oscillator circuit 100 in FIG. 1. The oscillator circuit 400 comprises the RF element 103 and a DC power supply circuit 401 which is an exemplary implementation of the DC power supply circuit 101 shown in FIG. 1.

The DC power supply circuit 401 comprises a first prescaler 403, an I/Q divider 405 and a second prescaler 407. Furthermore, the DC power supply circuit 401 comprises a first amplifier 411a and a second amplifier 411b. Furthermore, the DC power supply circuit 401 comprises a first rectifying diode 413a, a second rectifying diode 413b, a third rectifying diode 413c and a fourth rectifying diode 413d.

A BC junction of the rectifying diodes 413a-413d can be implemented using a B7HF200 process (to sustain a large reverse voltage). As an example, the rectifying diode 413a-413d can be poly-diodes. Nevertheless, the use of NPN transistors, PNP transistors or MOS-diodes is possible also.

Furthermore, the DC power supply circuit 401 comprises a low dropout regulator (LDO) 415. Furthermore, the DC power supply circuit 401 comprises an optional internal capacitance 417.

Furthermore, the oscillator circuit 400 comprises an output amplifier 419. The DC power supply circuit 401 can be optionally coupled to an external capacitance 421.

It has been found that often millimeter wavelength systems (24, 77, 86, 94, 122 GHz, etc.) show in their Tx a divider chain to downconvert the HF signal in baseband for frequency synthesis. Such a divider chain can comprise the first prescaler 403, the I/Q divider 405 and the second prescaler 407. As an example, this enables that a frequency in the range of around 10 GHz is available in such systems.

It has been found that these generated frequency signals can be rectified and used as base for the generation of the DC power supply signal 109 for the RF element 103.

The first prescaler 403 is configured to receive the RF output signal 111 and to divide a frequency of the RF output signal 111 by a first divider value to derive a first prescaler output signal 423. The I/Q divider 405 is configured to receive the first prescaler output signal 423 and to provide a first divider output signal 425a (for example an in-phase signal 425a) and a second divider output signal 425b (for example a quadrature signal 425b). A phase difference between the first divider output signal 425a and the second divider output signal 425b is 90°.

The first divider output signal 425a is provided to the first amplifier 411a and the second divider output signal 425b is provided to the second amplifier 411b.

The first amplifier 411a is configured to provide based on the received first divider output signal 425a a first oscillator signal 427a and a second oscillator signal 427b. The first oscillator signal 427a and the second oscillator signal 427b have a phase difference of 180°. Furthermore, the second amplifier 411b is configured to provide based on the second divider output signal 425b a third oscillator signal 427c and a fourth oscillator signal 427d. A phase difference between the third oscillator signal 427c and the fourth oscillator signal 427d is 180°. As the first divider output signal 425a and the second divider output signal 425b have a phase difference of 90°, also the first oscillator signal 427a and the third oscillator signal 427c have a phase difference of 90° and the first oscillator signal 427a and the fourth oscillator signal 427d have a phase difference of 270°.

The first amplifier 411a and the second amplifier 411b can be differential amplifiers. Furthermore, the first divider output signal 425a and the second divider output signal 425b can be differential signals.

The I/Q divider 405 provides the divider output signals 425a, 425b such that they have a duty cycle of 50%.

The DC power supply circuit 401 is configured to provide the DC power supply signal 109 based on the four oscillator signals 427a-427d as will be described in the following.

Since the divider output signals 425a, 425b are generated by the I/Q divider 405 and supposing it is flip-flop based (e.g., comprising a first latch 429a and a second latch 429b) all four phases are available (0°, 90°, 180°, 270°). These four phases can help to reduce the ripple on the output DC level. Furthermore, the divider output signals 425a, 425b are used to drive in saturation the two amplifiers or buffers 411a, 411b which may generate a lot of harmonics. But this is not an issue for a chip realized in a technology process which shows a fT, fmax>>10 GHz.

The oscillator signal 427a is provided to (an anode or input of) the first rectifying diode 413a, the second oscillator signal 427b is provided to (an anode or input of) the second rectifying diode 413b, the third oscillator signal 427c is provided to (an anode or input of) the third rectifying diode 413c and the fourth oscillator signal 427d is provided to (an anode or input of) the fourth rectifying diode 413d.

Cathodes (or outputs) of the rectifying diode 413a-413d are connected to a common superposition node 431 at which rectified versions of the oscillator signals 427a-427d are superpositioned to derive a combined signal 433. The combined signal 433 can be further filtered to derive the DC power supply signal 109.

In the example shown in FIG. 4a the combined signal 433 is provided to the low dropout regulator 415 which is configured to provide the DC power supply signal 109 based on the combined signal 433. The LDO 415 has two main functions, first, the LDO 415 can reduce a ripple of the combined signal 433 or in other words, the LDO 415 can perform a smoothing of the combined signal 433 to derive the power supply signal 109. Furthermore, the LDO 415 can be configured to lower the voltage of the combined signal 433 to derive the DC power supply signal 109.

Furthermore, as can be seen from FIG. 4a, the oscillator circuit 400 can comprise the (optional) on chip capacitance 417 which is connected between the superposition node 431 and a ground potential terminal of the oscillator circuit 400. Furthermore, the superposition node 431 can be coupled additionally or alternatively to the (optional) external capacitance 421 connected between the superposition node 431 and the ground potential terminal of the oscillator circuit 400.

The LDO 415, and the capacitances 417 and 421 can be used to lower a ripple of the DC power supply signal 109, as a ripple at the output 107 of the DC power supply circuit 401 could have an impact on the jitter and the single sideband phase noise of the VCO 119, if not properly filtered. Nevertheless, if according to some embodiments of the present invention the LDO 415 is not used and the combined signal 433 is supplied as the DC power supply signal 109 directly to the RF element 103 to supply an operational amplifier (for example of the voltage converter 117) this is still not an issue, because the bandwidth of such an operational amplifier in the voltage converter 117 can be chosen much lower than the spurs generated by the DC power supply circuit 401.

Hence, according to some embodiments of the present invention, the LDO 415 may be omitted and the combined signal 433 may be provided directly to the RF element 103.

To summarize, the differential I/Q signals 427a-427d from the power amplifiers 411a, 411b are coupled to the diodes 413a-413d used as rectifiers. The use of diodes 413a-413d has the advantage over using a transformer that no loss occurs which can reduce the efficiency.

At start-up of the oscillator circuit 400 the VCO 119 will start to oscillate. Even if the frequency is not exactly 10 GHz, also this is not an issue as the oscillator circuit 400 is broadband and the phase alignment between the oscillator signals 427a-427d are guaranteed by the asynchronous I/Q divider 405.

As an example, the oscillator signals 427a-427d could be seen as LO signals. The first oscillator signal 427a can be an LOI signal and the second oscillator signal 427b can be an LOIX signal. The third oscillator signal 427c can be an LOQ signal and the fourth oscillator signal 427d can be an LOQX signal.

According to further embodiments of the present invention, frequencies of the four oscillator signals 427a-427d are (at least in the tolerance range of ±1% of a frequency of one of the oscillator signals 427a-427d) identical.

Furthermore, the I/Q divider 405 can be configured to provide the divider output signals 425a, 425b as digital signals.

Furthermore, a frequency of the transmit signal 111 can vary (in dependence on the tuning signal 121). Nevertheless, the prescaler 403 can be configured to provide the first prescaler output signal 423 such that a frequency of the first prescaler output signal 423 stays constant for different frequencies of the RF output signal 111.

Hence, the DC power supply circuit 401 is configured to provide a plurality of oscillator signals 427a-427d such that the frequency of the plurality of oscillator signals 427a-427d stays constant for different frequencies of the received RF output signal 111.

By keeping the frequencies of the oscillator signals 427a-427d constant independent of the frequency of the RF output signal 111 filters for filtering the oscillator signals 427a-427d and/or the combined signal 433 can be chosen independent of the frequency of the RF output signal 111 and (only) depend on the (fixed) frequency of the oscillator signals 427a-427d. To summarize, the RF element 103 is configured to receive the tuning signal 121 and to provide based on the tuning signal 121 and based on the DC power supply signal 109 the RF output signal 111. The voltage converter 117 (which can be a level shifter or a charge pump or which can at least comprise a level shifter or charge pump) is configured to receive the DC power supply signal 109 from the DC power supply circuit 401 and to provide based on the DC power supply signal 109 and the tuning signal 121 the further tuning signal 131 to the voltage controlled oscillator 119. The voltage controlled oscillator 119 is configured to provide the RF output signal 111 and to adjust the frequency of the RF output signal 111 based on the received further tuning signal 131.

A voltage range of the tuning signal 121 is typically smaller than a voltage range of the further tuning signal 131. As an example, the voltage range of the tuning signal 121 may be from 0V to 1V, wherein the voltage range of the further tuning signal 131 can be from 0V to 6V. Hence, the tuning range of the voltage controlled oscillator 119 can be fully utilized.

As an example a maximum voltage of the further tuning signal 131 can be larger than a maximum voltage of the tuning signal 121.

Furthermore, the voltage controlled oscillator 119 can be configured to receive a further power supply signal (the VCO power supply signal 127) which is different to the DC power supply signal 109 provided by the DC power supply circuit 401.

Furthermore, the DC power supply circuit 401 and the RF element 103 can be integrated on the same semiconductor substrate (on one and the same chip).

Furthermore, the optional output amplifier 419 is configured to receive the RF output signal 111 and to provide an amplified version 435 of the RF output signal 111. According to further embodiments of the present invention, this output amplifier 419 may be omitted.

Furthermore, the second prescaler 407 can be configured to provide based on the first prescaler output signal 423 and/or at least one of the divider output signals 425a-425b a second prescaler output signal 437. Such second prescaler output signal 437 can be fed, for example, to a PLL (PLL—phase locked loop).

The amplifiers 411a, 411b can be high-speed and high-voltage devices.

Furthermore, the amplifiers 411a, 411b, the rectifying diodes 413a-413d and the LDO 415 can form a DC/DC converter of the DC power supply circuit 401, which is configured to derive based on the divider output signal 425a, 425b (which can be AC signals having a predetermined offset, such that they alternate between a ground potential and a maximum supply potential of the I/Q divider 405) the DC power supply signal 109.

Figure 4B:
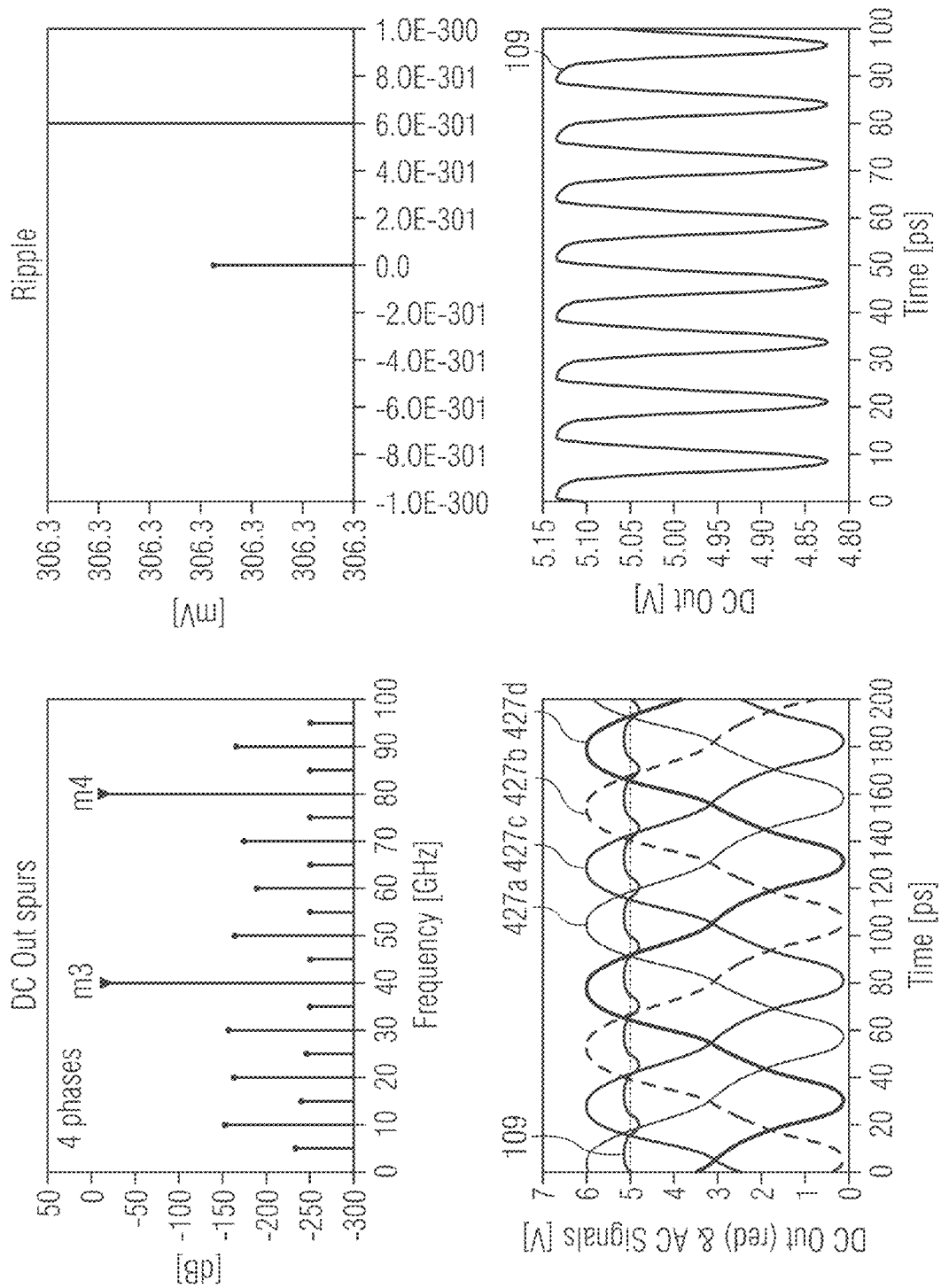
FIG. 4b shows a simulation of signals generated by the DC power supply circuit shown in FIG. 4a without additional filters connected to the DC power supply circuit.

FIG. 4b a simulation of the DC power supply signal 109 and the four oscillator signals 427a-427d for the case of having no filter connected to the superposition node 431 (for the case in which the capacitances 421, 417 are omitted).

It can be seen that a ripple of the DC power supply signal 109 of around 300 mV can be achieved. Furthermore, since all four phases are available and in the example of FIG. 4b the oscillator signals 427a-427d have a frequency of 10 GHz, the first spur, if everything is aligned, is at 40 GHz. The 40 GHz can be filtered out very easily and cheap. In any event, since 40 GHz is well above any operation amplifier bandwidth, it will be filtered out by the operational amplifier of the voltage converter 117 itself. So no spurs should be seen at the Vtune port (at the tuning input 129) of the VCO 119. And even in that case, it would appear at an offset not of interest.

Figure 4C:
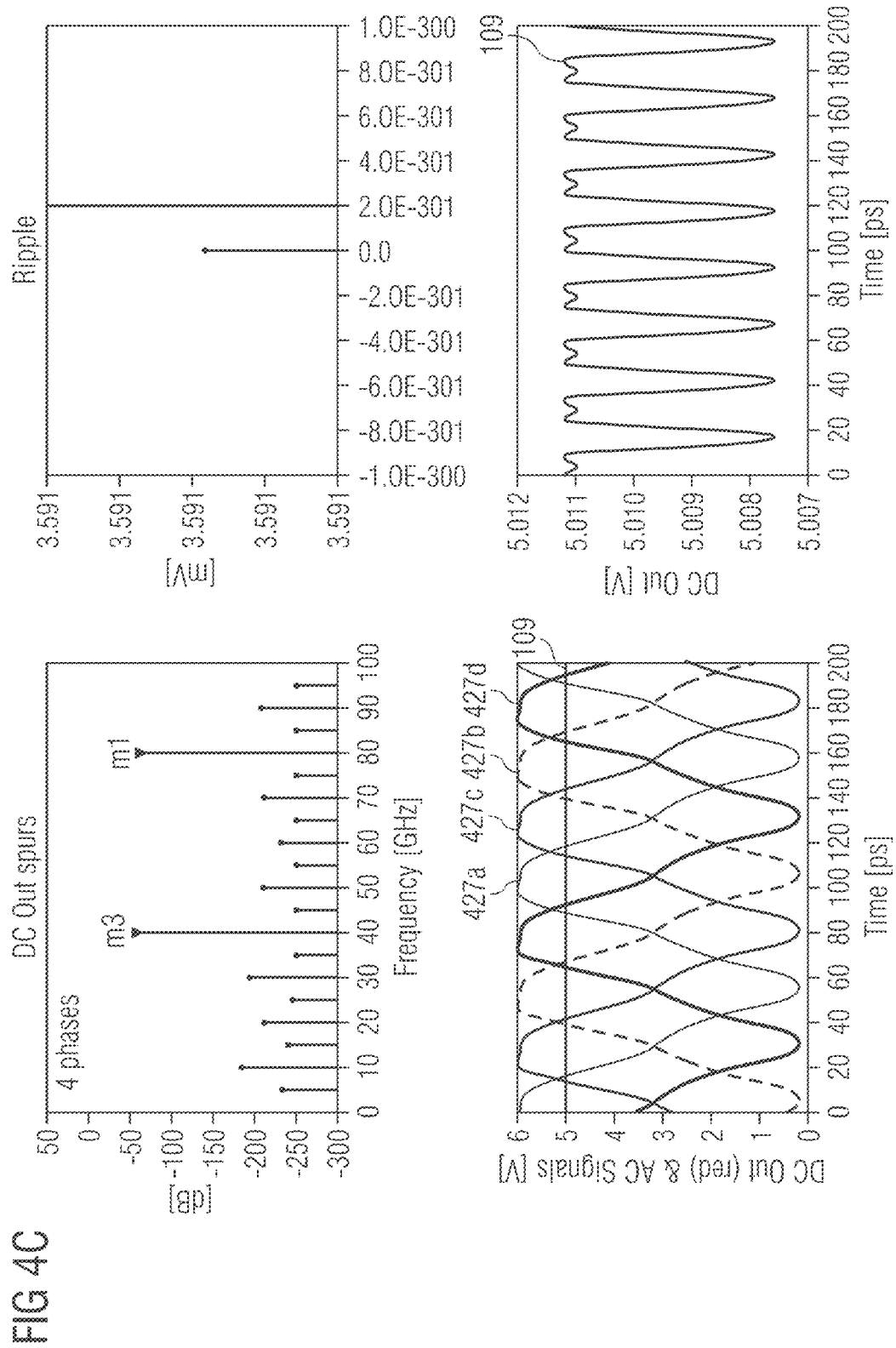
FIG. 4c shows a simulation of the signals from FIG. 4b with an additional on chip capacitor connected to the DC power supply circuit.

FIG. 4c shows a simulation of the same signals as in FIG. 4b with the difference that the internal capacitor 417 is connected to the superposition node 431 with a capacitance of 17.5 pF. As can be seen clearly in FIG. 4d these 17.5 pF are already sufficient to suppress the fundamental and reduce the 40 GHz signal. Hence, a resulting ripple of the DC power supply signal 109 is only about 3.6 mV.

Figure 4D:
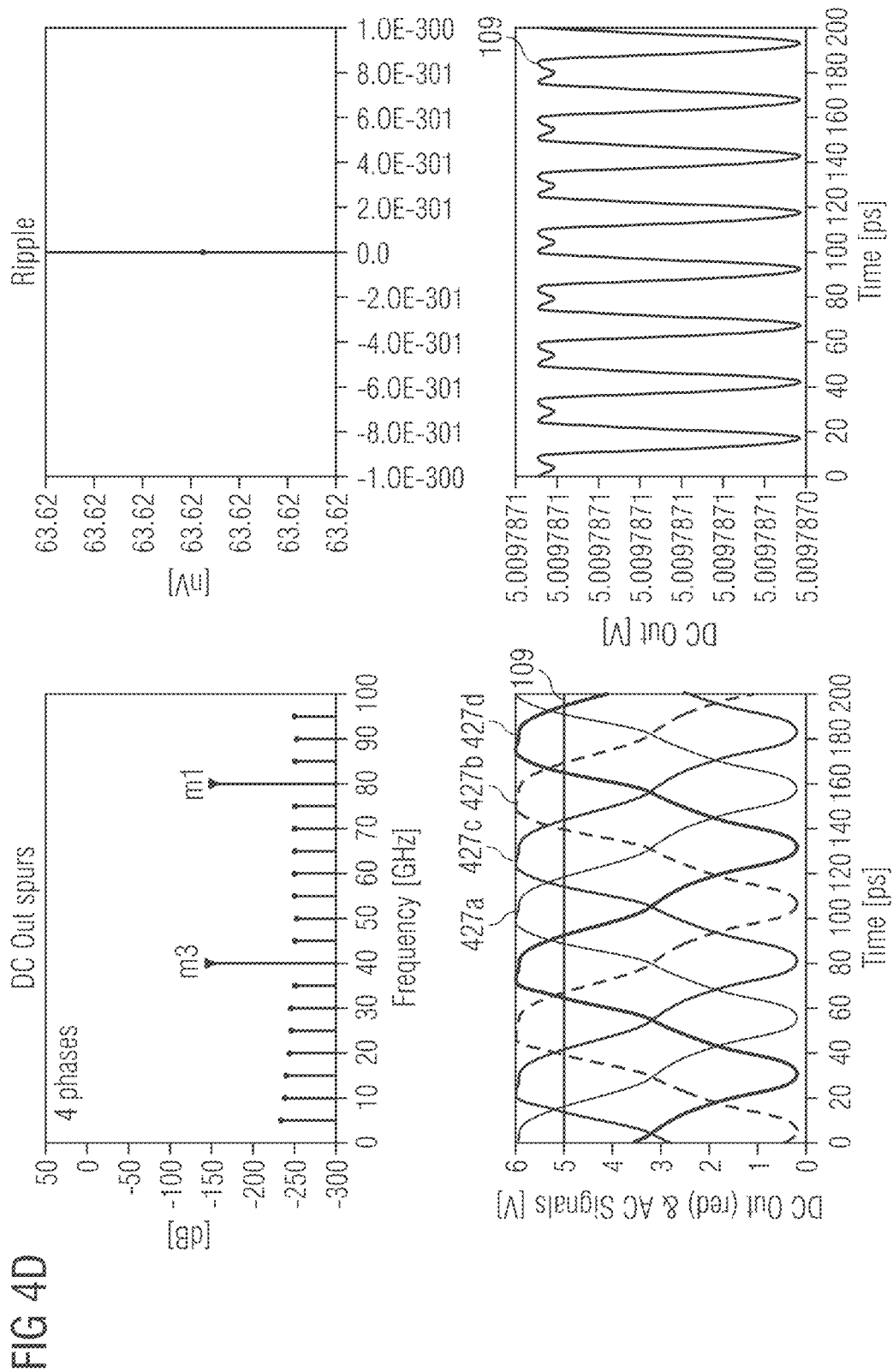
FIG. 4d shows a simulation of the signals from FIG. 4b with an additional external capacitor connected to the DC power supply circuit.

FIG. 4d shows the same simulation diagrams as in FIGS. 4b and 4c with the difference that no internal capacitance is spent, but the external capacitance 421 is connected to the superposition node 431 (e.g., having a capacitance of 1 μF). In this case a ripple of the DC power supply signal 109 of only about 63 nV can be achieved.

Figure 5B:
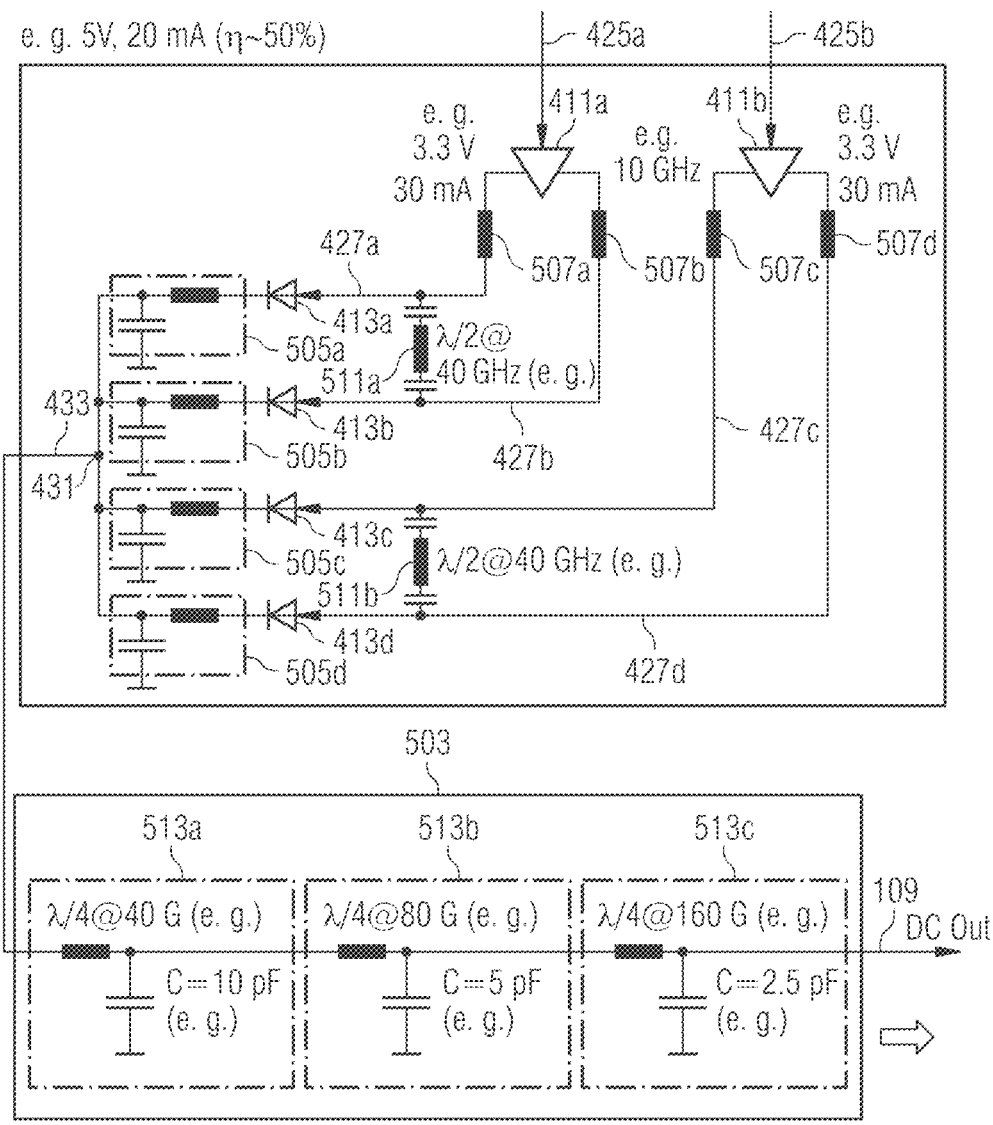
Figure 5D:
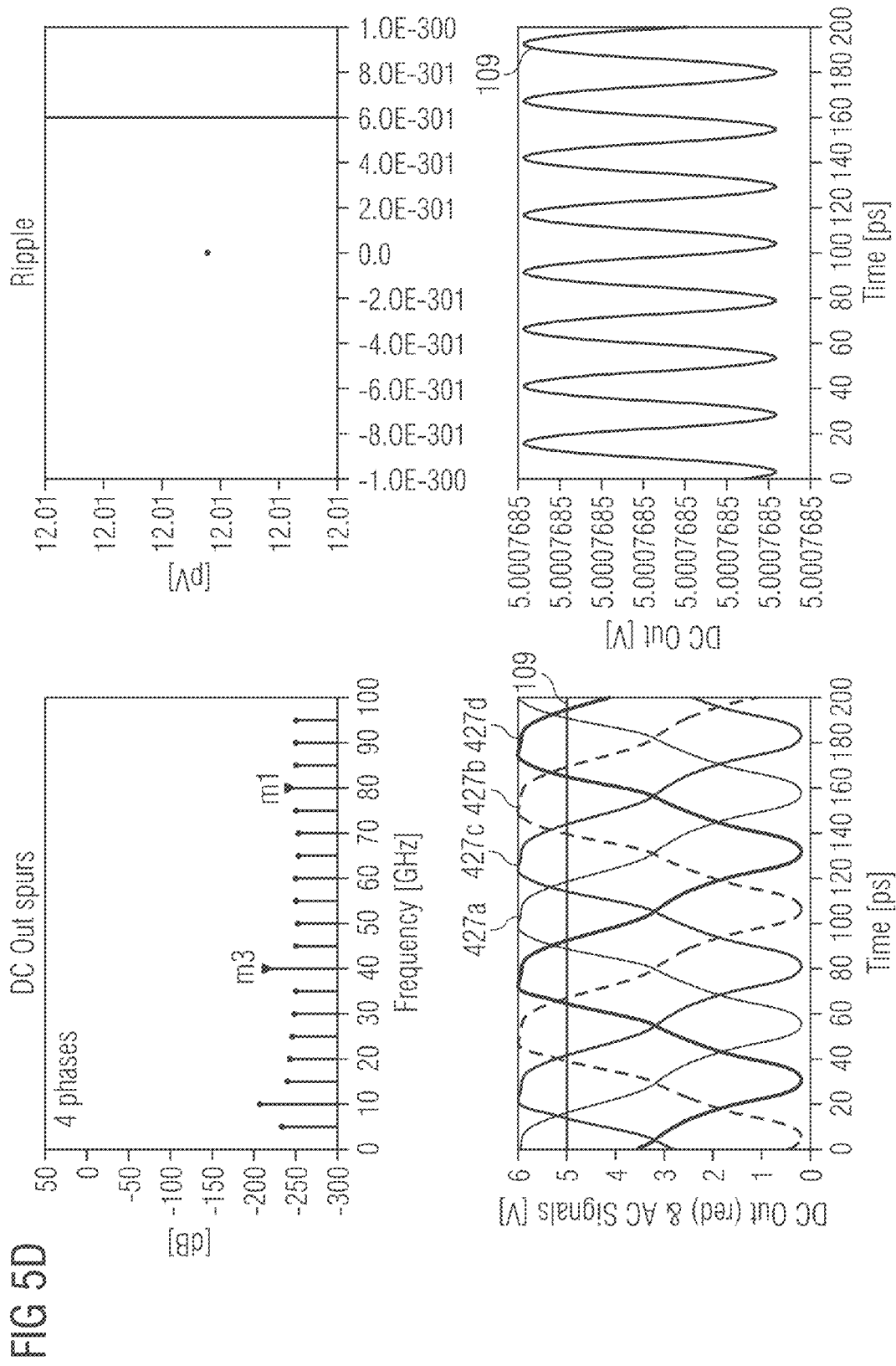

This performance can be further improved as will be shown in conjunction with FIG. 5d, if the LDO 415 is replaced by a suitable LC filter.

FIG. 5a shows an oscillator circuit 500 according to a further embodiment of the present invention comprising a DC power supply circuit 501 according to a further embodiment of the present invention. The oscillator circuit 500 is another exemplary implementation of the oscillator circuit 100 shown in FIG. 1. The oscillator circuit 500 differs from the oscillator circuit 400 in FIG. 4a in that in its DC power supply circuit 501 (and therefore in its DC/DC converter) the LDO 415 has been replaced by an LC filter 503 or output filter 503.

The DC power supply circuit 501 is another exemplary implementation of the DC power supply circuit 101 shown in FIG. 1 which, as already described, differs from the DC power supply circuit 401 in that the LDO 415 has been replaced by the LC filter 503. Hence, the LC filter 503 receives the combined signal 433 at the superposition node 431 and performs a filtering of the combined signal 433 to provide at an output of the LC filter 503 the DC power supply signal 109.

Since the power supply circuit 501 is running at a very high frequency (e.g., at 10 GHz), the power supply circuit 501 can be placed together with the LC filter 503 on the same chip (on the same semiconductor substrate).

Furthermore, the DC power supply circuit 501 comprises a first low-pass filter 505a coupled between the cathode of the first rectifying diode 413a and the superposition node 431, a second low-pass filter 500b coupled between the cathode of the second rectifying diode 413b and the superposition node 431, a third low-pass filter 505c coupled between the cathode of the third rectifying diode 413c and the superposition node 431 and a fourth low-pass filter 505d coupled between the cathode of the fourth rectifying diode 413d and the superposition node 431.

Although the low-pass filters 505a-505d shown in FIG. 5a have not been implemented in the DC power supply circuit 401 shown in FIG. 4a, according to further embodiments, the low-pass filters 505a-505d may be implemented in the DC power supply circuit 401 also.

The low-pass filters 505a-505d further improve the ripple of the oscillator signals 427a-427d and therefore the ripple of the resulting DC power supply signal 109.

Although in the example shown in FIG. 5a the low-pass filters 505a-505d are LC filters, an implementation using RC filters is possible also. Nevertheless, the implementation using LC filters has the advantage of a lower loss. And, as already described, implementing inductivity on chip is not an issue, as the DC power supply circuit 501 runs on very high frequencies (e.g., 10 GHz).

Furthermore, the DC power supply circuit 501 comprises a first impedance element 507a coupled between a first output of the first amplifier 411a and an anode of the first rectifying diode 413a, a second impedance element 507b coupled between a second output of the first amplifier 411a and an anode of the second rectifying diode 413b, a third impedance element 507c coupled between a first output of the second amplifier 411b and an anode of the third rectifying diode 413c and a fourth impedance element 507d coupled between a second output of the second amplifier 411b and the anode of the fourth rectifying diode 413.

Furthermore, the DC power supply circuit 501 comprises a fifth impedance element 509a coupled between the anode of the first rectifying diode 413a and the ground potential terminal of the DC power supply circuit 501, a sixth impedance element 509b coupled between the anode of the second rectifying diode 413b and the ground potential terminal, a seventh impedance element 509c coupled between the anode of the third rectifying diode 413c and the ground potential terminal and an eighth impedance element 509d coupled between the anode of the fourth rectifying diode 413d and the ground potential terminal.

Each impedance element 507a-507d, 509a-509d has a transmission line characteristic. These impedance elements 507a-507d, 509a-509d having a transmission line characteristic are used for matching with the rectifying diodes 413a-413d and signal peaking.

Although in the example shown in FIG. 5a the internal capacitance 417 is not shown, according to further embodiments of the present invention, the DC power supply circuit 501 can also comprise such internal capacitance 417 connected between the superposition node 431 and the ground potential terminal of the DC power supply circuit 501.

FIG. 5b shows an exemplary implementation for the LC filter 503. Furthermore, in FIG. 5b another exemplary implementation for the transmission lines coupled to the anodes of the rectifying diodes 413a-413d is shown. In the example shown in FIG. 5b instead of having the impedance elements 509a-509d coupled between the anodes of the rectifying diodes 413a-413d and the ground potential terminal, the DC power supply circuit 501 comprises a first AC coupled impedance element 511a and a second AC coupled impedance element 511b.

The first AC coupled impedance element 511a is AC coupled between the anode of the first rectifying diode 413a and the anode of the second rectifying diode 413b. Hence, the first impedance element 511a is AC coupled between the internal differential oscillator signal provided by the first amplifier 411a in form of the first oscillator signal 427a and the second oscillator signal 427b.

Furthermore, the second AC coupled impedance element 511b is AC coupled between the anode of the third rectifying diode 413c and the anode of the fourth rectifying diode 413d. Hence, the second AC coupled impedance element 511b is AC coupled between the differential oscillator signal provided by the second amplifier 411b in form of the third oscillator signal 427c and the fourth oscillator signal 427d.

The AC coupled impedance elements 511a, 511b between the differential oscillator signals can further improve the ripple of the resulting DC power supply signal 109. The AC coupled impedance elements 511a-511b have a transmission line characteristic. This transmission line characteristic can be chosen such that it is equal to a characteristic of a transmission line having a length of one half of a wavelength of a signal having a frequency which is an integer multiple of a frequency of the oscillator signals 427a-427d (e.g., 4 times the frequency of the oscillator signals 427a-427d). In the example shown in FIG. 5b, the AC coupled impedance elements 511a, 511b are chosen such that their transmission line characteristic is equal to a transmission line having a length of one half of the wavelength of a signal having a frequency of 40 GHz. This 40 GHz is the frequency at which the first spurs occur, if everything is aligned for a frequency of 10 GHz of the oscillator signals 427a-427d. Hence, the AC coupled impedance elements 511a-511b are chosen to reduce unwanted spurs.

In the following, the LC filter 503 will be described in more detail.

As can be seen from FIG. 5b, the LC filter 503 comprises a series connection of a first low-pass filter 513a, a second low-pass filter 513b and a third low-pass filter 513c. Nevertheless, according to further embodiments of the present invention, the LC filter 503 may comprise at minimum one of such low-pass filters. Each of the low-pass filter 513a-513c is implemented by an impedance element having a transmission line characteristic.

The impedance elements 513a-513c are chosen such that each of their transmission line characteristics equals a characteristic of a transmission line having a length of one quarter of a wavelength of a signal having a frequency which is a multiple of four times the frequency of the oscillator signals 427a-427d. As an example, the first low-pass filter 513a or first impedance element 513a has a transmission line characteristic which is equal to a characteristic of a transmission line having a length of $\Lambda/4$ at 40 GHz. The second low-pass filter 513b or second impedance element 513b has a transmission line characteristic which is equal to a characteristic of a transmission line having a length of $\Lambda/4$ at 80 GHz. The third low-pass filter 513c or third impedance element 513c has a transmission line characteristic which is equal to a characteristic of a transmission line having a length of $\Lambda/4$ at 160 GHz.

To summarize, the output filter 503 comprises a series connection of the plurality of impedance elements 513a-513c coupled between an input and an output of the output filter 503. Each impedance element 513a-513c has a transmission line characteristic which is equal to a characteristic of a transmission line having a length of one quarter of a wavelength of a signal having a frequency which is $2^n$ times the frequency of the oscillator signals 427a-427d, wherein n=2, 3, 4, ..., N. n is chosen such that it is different for different impedance elements 513a-513c of the output filter 503.

FIG. 5d shows a simulation of the same signals as FIGS. 4b-4d, but using the implementation of the DC power supply circuit 501 as shown in FIG. 5b and with an additional internal capacitance 417 of 15 pF. Since the four phases of the oscillator signals 127a-127d exist in the DC power supply circuit 501, and the signal is running at 10 GHz, the first spur, if everything aligned is at 40 GHz. Thanks to the LC filter 503 the ripple of the DC power supply signal 109 is only 5 µV. Furthermore, 40 GHz is well above of any operation amplifier bandwidth that could be used in the voltage converter 117 for level shifting. Thus, the 40 GHz is filtered out by the operational amplifier in the voltage converter 117 itself and is not present at the tuning input 129 of the VCO 119. Thus, an additional LDO or regulator for providing the DC power supply signal 109 can be avoided.

FIG. 5d shows a simulation of the same signals as in FIG. 5c but with having 1 µF external capacitance 421 with connected to the superposition node 431. This one 1 µF external capacitance 421 together with the LC filter 503 reduces the ripple (or noise) on the DC power supply signal 109 to 12 pV only.

Especially when compared to FIG. 5c in which the external capacitor 421 was used without the LC filter 503, it can be seen that by using the LC filter 503 in conjunction with the external capacitor 421 a much better performance can be reached.

To summarize, embodiments of the present invention make a voltage domain on a chip available which enables to let the tuning input 129 of the VCO 119 go above a supply voltage of the VCO 119 and a supply voltage of the MCU 123.

Especially the next generation transmitter RF/HF domain will target low power consumption. Typically low power consumption is going together with a low voltage supply. Hence, considering also next generation MCUs/ASIC in nanoscaling CMOS technology it would be helpful to not jeopardize the supply voltage domain that a regulator and a single system need to provide. This is achieved by embodiments of the present invention, as the DC power supply voltage 109 (which is used to bring the tuning signal 121 from the low voltage domain of the MCU 123 to the high voltage domain needed at the tuning input 129 of the VCO 119) is generated based on the RF output signal 111 provided by the VCO 119. Furthermore, it has been found that several elements, like the first prescaler 403 and the I/Q divider 405 are already available in typical oscillator systems. Hence, the additional circuitry needed to derive based on the RF output signal 111 the DC power supply signal 109 can be kept as low as possible by using these already available units in an oscillator circuit.

To summarize, some embodiments of the present invention provide a transmitter with an on chip DC/DC converter which is configured to derive based on a generated RF output signal 111 a DC power supply signal 109 for an RF element 103 generating the RF output signal 111.

FIG. 6 shows a flow diagram of a method 600 according to an embodiment of the present invention.

The method 600 for generating a DC power supply signal comprises a step 601 of receiving an RF output signal.

Furthermore, the method 600 comprises a step 603 of generating based on the RF output signal the DC power supply signal.

Furthermore, this method 600 comprises a step 605 of providing the DC power supply signal to an RF element for generating the RF output signal.

The method 600 may be performed by any DC power supply circuit or oscillator circuit according to an embodiment of the present invention.

The method 600 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some examples, some one or more of the most important method steps may be executed by such an apparatus.

Depending on certain implementation requirements, examples can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples can be implemented as a computer program product with a program code, the program code being operative for performing one of the methods when the computer program product runs on a computer. The program code may for example be stored on a machine readable carrier.

Other examples comprise the computer program for performing one of the methods described herein, stored on a machine readable carrier.

In other words, an implementation of the exemplary method is, therefore, a computer program having a program code for performing one of the methods described herein, when the computer program runs on a computer.

A further implementation of the exemplary method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further implementation of the exemplary method is, therefore, a data stream or a sequence of signals representing the computer program for performing one of the methods described herein. The data stream or the sequence of signals may for example be configured to be transferred via a data communication connection, for example via the Internet.

A further example comprises a processing means, for example a computer, or a programmable logic device, configured to or adapted to perform one of the methods described herein.

A further example comprises a computer having installed thereon the computer program for performing one of the methods described herein.

A further example comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are preferably performed by any hardware apparatus.

The above described examples are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

Although each claim only refers back to one single claim, the disclosure also covers any conceivable combination of claims.

What is claimed is:

1. A DC power supply circuit comprising:
  an output configured to provide a DC power supply signal to an RF element for generating an RF output signal;
  an input configured to receive the RF output signal;
  wherein the DC power supply circuit is configured to generate the DC power supply signal based on the received RF output signal;
  wherein the DC power supply circuit is configured to provide based on the received RF output signal a plurality of oscillator signals;
  wherein different oscillator signals of the plurality of oscillator signals have different phases; and
  wherein the DC power supply circuit is configured to generate the DC power supply signal based on the plurality of oscillator signals.

2. The DC power supply circuit according to claim 1, wherein the DC power supply circuit is configured to generate the DC power supply signal based on a combination of the plurality of oscillator signals.

3. The DC power supply circuit according to claim 1, further comprising:
  a first amplifier, the first amplifier comprising a first amplifier output for providing a first oscillator signal of the plurality of oscillator signals and a second amplifier output for providing a second oscillator signal of the plurality of oscillator signals, the second oscillator signal having a phase difference of 180° with respect to the first oscillator signal;

wherein the DC power supply circuit further comprises an impedance element having a transmission line characteristic, the impedance element being coupled between the first amplifier output and the second amplifier output.

4. The DC power supply circuit according to claim 3, wherein the impedance element coupled between the first amplifier output and the second amplifier output is chosen such that its transmission line characteristic is equal to a characteristic of a transmission line having a length of one half of a wavelength of a signal having a frequency which is an integer multiple of a frequency of the first oscillator signal or the second oscillator signal.

5. The DC power supply circuit according to claim 1, further comprising:
 a plurality of rectifying diodes, wherein each rectifying diode is configured to receive at its input one of the plurality of oscillator signals and to provide at its output a rectified version of the oscillator signal received at its input;
 wherein the DC power supply circuit is configured such that the DC power supply signal is based on a superposition of the rectified versions of the oscillator signals provided at the outputs of the rectifying diodes.

6. The DC power supply circuit according to claim 5, further comprising:
 at least one filter element coupled between an output of one of the rectifying diodes and a superposition node at which the rectified versions of the oscillator signals are superpositioned.

7. The DC power supply circuit according to claim 1,
 wherein the DC power supply circuit is configured to generate based on the plurality of oscillator signals a combined signal; and
 wherein the DC power supply circuit further comprises an output filter having at least one impedance element with a transmission line characteristic configured to receive the combined signal at an input and to provide at an output the DC power supply signal based on the received combined signal.

8. The DC power supply circuit according to claim 7, wherein the impedance element of the output filter is chosen such that the impedance element's transmission line characteristic equals a characteristic of a transmission line having a length of one quarter of a wavelength of a signal having a frequency which is an integer multiple of a frequency of one of the oscillator signals of the plurality of oscillator signals.

9. The DC power supply circuit according to claim 1, wherein the DC power supply circuit is configured to provide the plurality of oscillator signals such that a frequency of at least one of the plurality of oscillator signals stays constant for different frequencies of the received RF output signal.

10. The DC power supply circuit according to claim 1,
 wherein the DC power supply circuit is configured to generate based on the plurality of oscillator signals a combined signal; and
 wherein the DC power supply circuit further comprises a Low Drop Out regulator configured to provide the DC power supply signal based on the combined signal.

11. A DC power supply circuit comprising:
 an output configured to provide a DC power supply signal to an RF element for generating an RF output signal; and
 an input configured to receive the RF output signal, wherein the DC power supply circuit is configured to generate the DC power supply signal based on the received RF output signal, and wherein the DC power supply circuit is configured to provide based on the received RF output signal a first oscillator signal, a second oscillator signal having a phase difference of 180° with respect to the first oscillator signal, a third oscillator signal having a phase difference of 90° with respect to the first oscillator signal and a fourth oscillator signal having a phase difference of 270° with respect to the first oscillator signal.

12. The DC power supply circuit according to claim 11, wherein the DC power supply circuit is configured to provide the first, second, third and fourth oscillator signal such that they have the same frequency.

13. The DC power supply circuit according to claim 12,
 wherein the DC power supply circuit is configured to generate based on the first, second, third and fourth oscillator signal a combined signal; and
 wherein the DC power supply circuit comprises an output filter configured to receive the combined signal at its input and to provide the DC power supply signal at its output.

14. The DC power supply circuit according to claim 13, wherein the output filter comprises an impedance element having a transmission line characteristic which is equal to a characteristic of a transmission line having a length of one quarter of a wavelength of a signal having four times the frequency of the frequency of the oscillator signals.

15. The DC power supply circuit according to claim 13,
 wherein the output filter comprises a series connection of a plurality of impedance elements coupled between the input and the output of the output filter;
 wherein each impedance element has a transmission line characteristic which is equal to a characteristic of a transmission line having a length of one quarter of a wavelength of a signal having a frequency which is $2^n$ times the frequency of the first, second, third and fourth oscillator signal, wherein n=2, 3, 4, . . . , N; and
 wherein n is different for different impedance elements of the output filter.

16. A DC power supply circuit comprising:
 an output configured to provide a DC power supply signal to an RF element for generating an RF output signal; and
 an input configured to receive the RF output signal;
 wherein the DC power supply circuit is configured to generate the DC power supply signal based on the received RF output signal;
 a first prescaler configured to scale a frequency of the received RF output signal to derive a first prescaler output signal, a frequency of which stays constant for different frequencies of the received RF output signal;
 wherein the DC power supply circuit is configured to generate the DC power supply signal based on the first prescaler output signal;
 an I/Q divider configured to provide based on the first prescaler output signal a first divider output signal and a second divider output signal, wherein a phase difference between the first divider output signal and the second divider output signal is 90°; and
 wherein the DC power supply circuit is configured to generate the DC power supply signal based on the first divider output signal and the second divider output signal.

17. The DC power supply circuit according to claim 16,
wherein the I/Q divider comprises at least a first latch and a second latch for providing the first divider output signal and the second divider output signal; and
wherein the I/Q divider is configured to provide the first divider output signal and the second divider output signal as digital signals.

18. The DC power supply circuit according to claim 16, further comprising;
a first amplifier for receiving the first divider output signal and for providing based on the received first divider output signal a first oscillator signal and a second oscillator signal, wherein a phase difference between the first oscillator signal and the second oscillator signal is 180°; and
a second amplifier for receiving the second divider output signal and for providing based on the received second divider output signal a third oscillator signal and a fourth oscillator signal, wherein a phase difference between the third oscillator signal and the fourth oscillator signal is 180°.

19. An oscillator circuit comprising:
an RF element configured to receive a tuning signal and to provide based on the tuning signal an RF output signal; and
a DC power supply circuit comprising:
an output configured to provide a DC power supply signal to the RF element for generating the RF output signal;
an input configured to receive the RF output signal;
wherein the DC power supply circuit is configured to generate the DC power supply signal based on the received RF output signal;
wherein the RF element comprises a voltage converter and a voltage controlled oscillator;
wherein the voltage converter is configured to receive the DC power supply signal from the DC power supply circuit and to provide based on the DC power supply signal and the tuning signal a further tuning signal to the voltage controlled oscillator; and
wherein the voltage controlled oscillator is configured to provide the RF output signal and to adjust a frequency of the RF output signal based on the received further tuning signal.

20. The oscillator circuit according to claim 19, wherein a voltage range of the tuning signal is smaller than a voltage range of the further tuning signal.

21. The oscillator circuit according to claim 19, wherein the voltage controlled oscillator is configured to receive a VCO power supply signal which is different from the DC power supply signal provided by the DC power supply circuit.

22. The oscillator circuit according to claim 19, wherein the DC power supply circuit and the RF element are integrated on the same semiconductor substrate.

23. An oscillator circuit comprising:
an RF element comprising:
a voltage converter and a voltage controlled oscillator;
wherein the voltage converter is configured to receive a tuning signal in a comparatively low voltage domain and a DC power supply signal and to provide based on the received tuning signal and the received DC power supply signal a further tuning signal in a comparatively high voltage domain;
wherein the voltage controlled oscillator is configured to receive the further tuning signal, provide an RF output signal and vary a frequency of the RF output signal in dependence on a voltage of the received further tuning signal;
a DC power supply circuit comprising:
an output configured to provide the DC power supply signal to the RF element;
an input configured to receive the RF output signal; and
an output filter;
wherein the DC power supply circuit is configured to provide based on the received RF output signal a first oscillator signal, a second oscillator signal having a phase difference of 180° with respect to the first oscillator signal, a third oscillator signal having a phase difference of 90° with respect to the first oscillator signal and a fourth oscillator signal having a phase difference of 270° with respect to the first oscillator signal;
wherein the DC power supply circuit is configured to provide the first, second, third and fourth oscillator signal such that the first, second, third and fourth oscillator signals have the same frequency;
wherein the DC power supply circuit is configured to generate based on a superposition of the first, second, third and fourth oscillator signal a combined signal;
wherein the output filter is configured to receive the combined signal at its input and to provide the DC power supply signal at its output;
wherein the output filter comprises a series connection of a plurality of impedance elements coupled between the input and the output of the output filter;
wherein each impedance element of the plurality of impedance elements has a transmission line characteristic which is equal to a characteristic of a transmission line having a length of one quarter of a wavelength of a signal having a frequency which is $2^n$ times the frequency of the first, second, third and fourth oscillator signal, wherein n=2, 3, 4, . . . , N; and
wherein n is different for different impedance elements of the output filter.

* * * * *